(12) United States Patent
Jin

(10) Patent No.: US 12,329,001 B2
(45) Date of Patent: Jun. 10, 2025

(54) DISPLAY PANEL, DETECTION METHOD AND DISPLAY DEVICE

(71) Applicant: Wuhan Tianma Micro-Electronics Co., Ltd., Wuhan (CN)

(72) Inventor: Chunming Jin, Wuhan (CN)

(73) Assignee: Wuhan Tianma Micro-Electronics Co., Ltd., Wuhan (CN)

( * ) Notice: Subject to any disclaimer, the term of this patent is extended or adjusted under 35 U.S.C. 154(b) by 0 days.

(21) Appl. No.: 18/234,497

(22) Filed: Aug. 16, 2023

(65) Prior Publication Data

US 2024/0407207 A1     Dec. 5, 2024

(30) Foreign Application Priority Data

May 31, 2023   (CN) .......................... 202310649123.7

(51) Int. Cl.
*G09G 3/00*      (2006.01)
*G09G 3/3233*    (2016.01)
*H10K 59/12*     (2023.01)
*H10K 59/131*    (2023.01)

(52) U.S. Cl.
CPC ........... *H10K 59/131* (2023.02); *G09G 3/006* (2013.01); *G09G 3/3233* (2013.01); *H10K 59/1201* (2023.02); *G09G 2300/0842* (2013.01); *G09G 2330/12* (2013.01)

(58) Field of Classification Search
CPC ........................... G09G 3/006; G09G 2330/12
See application file for complete search history.

(56) References Cited

U.S. PATENT DOCUMENTS

| | | | |
|---|---|---|---|
| 2009/0206334 A1* | 8/2009 | Yoon .................... | H10K 59/131 257/E23.002 |
| 2015/0084052 A1* | 3/2015 | Zhang .................. | H01L 27/124 257/48 |
| 2016/0372029 A1* | 12/2016 | Park ..................... | G09G 3/3233 |
| 2024/0038147 A1* | 2/2024 | Hwang .................. | G09G 3/32 |
| 2024/0046828 A1* | 2/2024 | Oh ........................ | G09G 3/2003 |

* cited by examiner

*Primary Examiner* — Yuzhen Shen
(74) *Attorney, Agent, or Firm* — Anova Law Group, PLLC

(57) ABSTRACT

A display panel, a detection method of a display panel, and a display device are provided. The display panel includes a display region and a non-display region surrounding the display region. The display region includes a plurality of sub-pixels and at least one first detection line. At least one sub-pixel of the plurality of sub-pixels includes at least one to-be-tested device, and the at least one to-be-tested device is electrically connected to the at least one first detection line. The non-display region includes at least one detection pad, and a detection pad of the at least one detection pad is electrically connected to a first detection line of the at least one first detection line.

15 Claims, 14 Drawing Sheets

DISPLAY PANEL, DETECTION METHOD AND DISPLAY DEVICE

CROSS-REFERENCE TO RELATED APPLICATION

This application claims the priority of Chinese patent application No. 202310649123.7, filed on May 31, 2023, the entirety of which is incorporated herein by reference.

FIELD

The present disclosure generally relates to the field of display technology and, more particularly, relates to a display panel, a detection method of a display panel, and a display device.

BACKGROUND

With the continuous development of technology, organic light-emitting diode (OLED) display panels have been rapidly growing due to their advantages of high brightness, low driving voltage, and energy-saving.

In an OLED display device, a pixel circuit is often required to drive the light-emitting element (e.g., an OLED). The existing pixel circuit often includes a plurality of transistors, such as driving transistors, by adjusting the driving current generated by the driving transistor, the light-emitting element is controlled to emit light. Whether a device in a sub-pixel contains defects directly impacts the light-emitting performance of the light-emitting element, thereby affecting the display effect of the display panel.

Therefore, how to provide a display panel and a display device capable of detecting the operational characteristics and parameters of the device in the sub-pixel and improving the product quality and yield is an urgent technical problem that needs to be solved.

SUMMARY

One aspect of the present disclosure provides a display panel. The display panel includes a display region and a non-display region surrounding the display region. The display region includes a plurality of sub-pixels and at least one first detection line. At least one sub-pixel of the plurality of sub-pixels includes at least one to-be-tested device, and the at least one to-be-tested device is electrically connected to the at least one first detection line. The non-display region includes at least one detection pad, and a detection pad of the at least one detection pad is electrically connected to a first detection line of the at least one first detection line.

Another aspect of the present disclosure provides a detection method of a display panel. The method includes proving a display panel. The display panel includes a display region and a non-display region surrounding the display region. The display region includes a plurality of sub-pixels and at least one first detection line. At least one sub-pixel of the plurality of sub-pixels includes at least one to-be-tested device, and the at least one to-be-tested device is electrically connected to the at least one first detection line. The non-display region includes at least one detection pad, and a detection pad of the at least one detection pad is electrically connected to a first detection line of the at least one first detection line. The method also includes determining a current signal on the first detection line according to a signal on the detection pad. Further, the method includes determining whether there are defects in a sub-pixel where the at least one to-be-tested device is located according to the current signal.

Another aspect of the present disclosure provides a display device. The display device includes a display panel. The display panel includes a display region and a non-display region surrounding the display region. The display region includes a plurality of sub-pixels and at least one first detection line. At least one sub-pixel of the plurality of sub-pixels includes at least one to-be-tested device, and the at least one to-be-tested device is electrically connected to the at least one first detection line. The non-display region includes at least one detection pad, and a detection pad of the at least one detection pad is electrically connected to a first detection line of the at least one first detection line.

Other aspects of the present disclosure can be understood by those skilled in the art in light of the description, the claims, and the drawings of the present disclosure.

BRIEF DESCRIPTION OF THE DRAWINGS

To more clearly illustrate the embodiments of the present disclosure, the drawings will be briefly described below. The drawings in the following description are certain embodiments of the present disclosure, and other drawings may be obtained by a person of ordinary skill in the art in view of the drawings provided without creative efforts.

DETAILED DESCRIPTION OF THE DISCLOSURE

Reference will now be made in detail to exemplary embodiments of the disclosure, which are illustrated in the accompanying drawings. Wherever possible, the same reference numbers will be used throughout the drawings to refer to the same or the alike parts. The described embodiments are some but not all of the embodiments of the present disclosure. Based on the disclosed embodiments, persons of ordinary skill in the art may derive other embodiments consistent with the present disclosure, all of which are within the scope of the present disclosure.

Various modifications and changes can be made to the embodiments of the present disclosure without departing from the spirit or scope of the present disclosure, which is apparent to those skilled in the art. Therefore, the present disclosure is intended to cover modifications and changes falling within the scope of the corresponding claims (the technical solutions to be protected) and their equivalents. It should be noted that the embodiments provided by the present disclosure can be combined with each other without contradiction.

Similar reference numbers and letters represent similar terms in the following Figures, such that once an item is defined in one Figure, it does not need to be further discussed in subsequent Figures.

Figure 1:
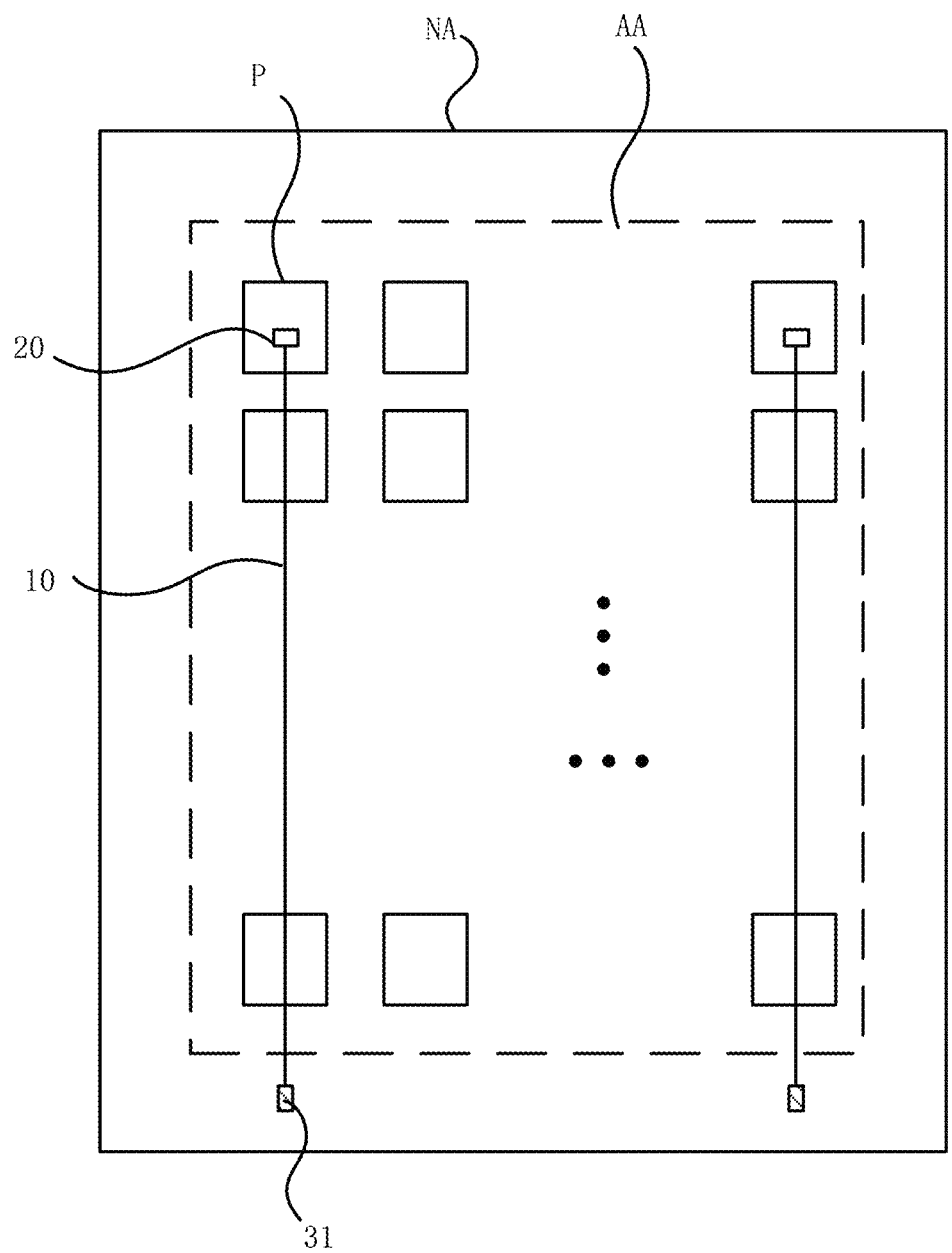
FIG. 1 illustrates a schematic diagram of a planar structure of an exemplary display panel consistent with disclosed embodiments of the present disclosure.

The present disclosure provides a display panel. FIG. 1 illustrates a schematic diagram of a planar structure of a display panel consistent with disclosed embodiments of the present disclosure. Referring to FIG. 1, the display panel may include a display region AA and a non-display region NA surrounding the display region AA.

The display region AA may include a plurality of sub-pixels P and at least one first detection line 10. At least one sub-pixel P may include at least one to-be-tested device 20. The at least one to-be-tested device 20 may be electrically connected to the at least one first detection line 10.

The non-display region NA may include at least one detection pad 31, and the detection pad 31 may be electrically connected to the first detection line 10.

In one embodiment, the disclosed display panel may include the display region AA and the non-display region NA surrounding the display region AA. The display region AA may often include elements capable of achieving the display function, such as sub-pixels, scan lines, signal lines, pixel electrodes, etc. In another embodiment, when the display panel further includes a touch-control function, the display region AA may further include touch-control electrodes and touch-control signal lines. The non-display region NA may be understood as a border region of the display panel, and the driving circuits such as scan driving circuits may be disposed in the non-display region NA. The structure of the disclosed display panel may not be limited to the above description, which may not be limited by the present disclosure and may be understood by referring to related technology.

Figure 2:
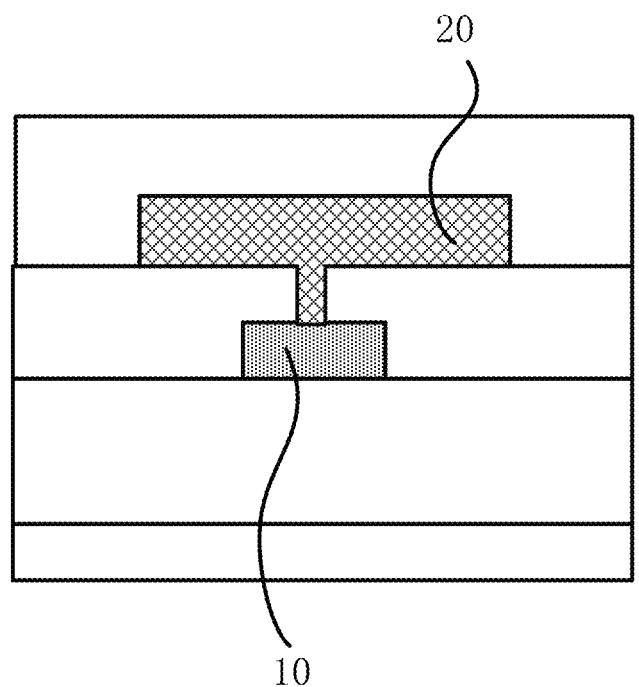
FIG. 2 illustrates a local schematic diagram of an exemplary display panel consistent with disclosed embodiments of the present disclosure.

The disclosed display panel may include an organic light-emitting diode (OLED) display panel. The display panel may include a plurality of sub-pixels P, and the plurality of sub-pixels P may be located in the display region AA. In one embodiment, the plurality of sub-pixels P may include sub-pixels with different colors, such as a red sub-pixel, a green sub-pixel, a blue sub-pixel, and a white sub-pixel. The plurality of sub-pixels P may be arranged in an array on the display panel, or may be arranged in any other layout. For illustrative purposes, as shown in FIG. 1, the plurality of sub-pixels P may be arranged in an array as an example. In another embodiment, as shown in FIG. 2, an orthographic projection of the sub-pixel P onto the light-emitting surface of the display panel may have a strip shape as an example. During actual implementation, the shape of sub-pixel P may not be limited to such shape, and may be designed according to practical requirements.

At least one sub-pixel P in the display region AA may include at least one to-be-tested device 20, and the to-be-tested device 20 may be electrically connected with the first detection line 10. The first detection line 10 may be electrically connected with the detection pad 31, in other words, the detection pad 31 may serve as a test terminal. A current signal on the to-be-tested device 20 in the sub-pixel P may be transmitted to the detection pad 31 through the first detection line 10. The current signal on the first detection line 10 electrically connected to the detection pad 31 may be determined based on the signal on the detection pad 31. Therefore, according to the current signal, it may be determined whether there are defects in the device in the sub-pixel P where the to-be-tested device 20 electrically connected to the first detection line 10 is located. The operational characteristics and parameters of the device in the sub-pixel P may be detected according to the current signal, which may enable the identification and elimination of defective products, may prevent the defective products from being released into the market, and may improve product yield. The detection structure of the disclosed display panel may be simple, which may enable direct detection of whether there are issues in the device in the sub-pixel P in the display region AA, may facilitate to achieve the detection of the device in the sub-pixel P of the display panel, thereby improving product quality and yield and reducing cost.

It should be noted that the specific location of the to-be-tested device 20 in the sub-pixel P that needs to be tested may not be strictly limited. For example, as shown in FIG. 1, when it is necessary to test the to-be-tested device 20 in the sub-pixel P located at the corner of the display panel, the first detection line 10 may be set to be connected to the to-be-tested device 20 and the detection pad 31 in the sub-pixel P at such location, thereby achieving the test of the to-be-tested device 20 in the sub-pixel P at such location. Similarly, for testing the to-be-tested device 20 in the sub-pixel P located at any other vulnerable position on the display panel, the first detection line 10 may be set to be connected to the to-be-tested device 20 and the detection pad 31 in the sub-pixel P at such location, thereby achieving the test of the to-be-tested device 20 in the sub-pixel P at such location and achieving the test of the device in the sub-pixel P provided with the to-be-tested device 20, which may not be repeated herein.

FIG. 2 illustrates a local schematic diagram of a display panel consistent with disclosed embodiments of the present disclosure. Referring to FIG. 1 and FIG. 2, in certain embodiments, the first detection line 10 and the to-be-tested device 20 may be located in different film layers.

In certain embodiments, the first detection line 10 and the to-be-tested device 20 may be located in different film layers, to prevent the disposure of the first detection line 10 from affecting the disposure of the to-be-tested device 20 in the sub-pixel P. In one embodiment, the first detection line 10 may be electrically connected to the corresponding to-be-tested device 20 through a vias.

Figure 3:
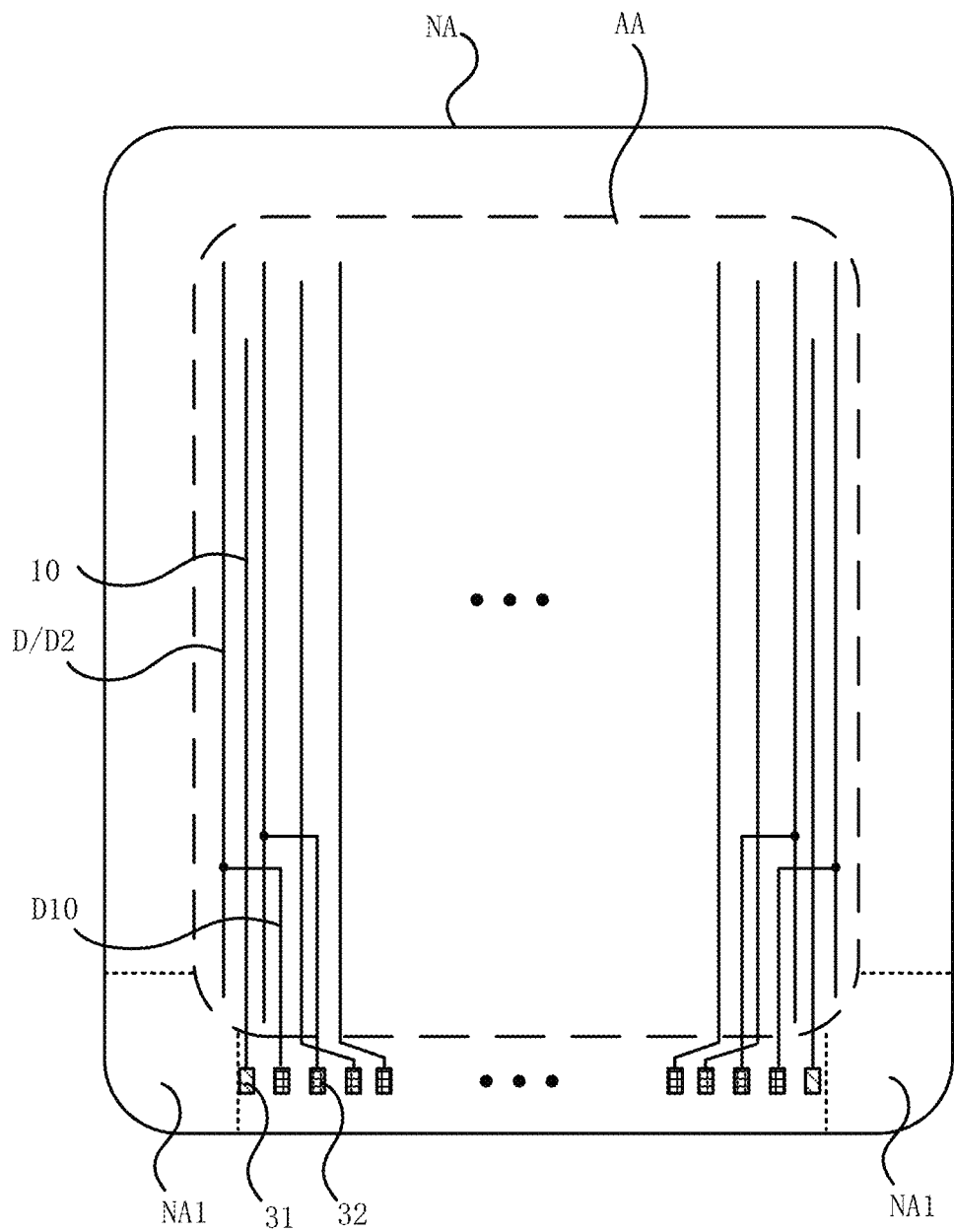
FIG. 3 illustrates a schematic diagram of a planar structure of another exemplary display panel consistent with disclosed embodiments of the present disclosure.
Figure 4:
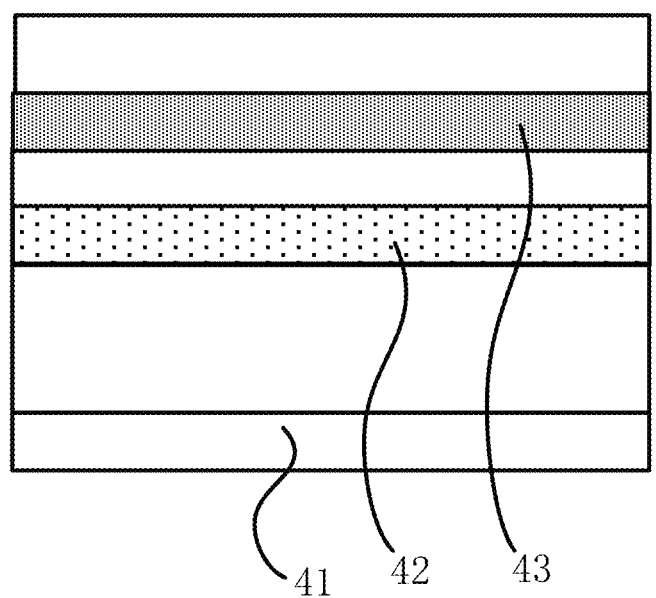
FIG. 4 illustrates a schematic diagram of film layers of an exemplary display panel consistent with disclosed embodiments of the present disclosure.

FIG. 3 illustrates a schematic diagram of a planar structure of a display panel consistent with disclosed embodiments of the present disclosure; and FIG. 4 illustrates a schematic diagram of film layers of a display panel consistent with disclosed embodiments of the present disclosure. Referring to FIG. 3 and FIG. 4, in certain embodiments, the display panel may further include a plurality of data lines D and at least one data connecting line D10. At least one data line D may be electrically connected to the data connecting line D10, and the data connecting line D10 may be located in the display region AA.

The display panel may further include a substrate 41, a first metal layer 42, and a second metal layer 43. The first metal layer 42 may be located between the substrate 41 and the second metal layer 43. The data line D may be located within the first metal layer 42, and at least a portion of the data connecting line D10 may be located within the second metal layer 43. At least a portion of the first detection line 10 may be located within the second metal layer 42.

In one embodiment, the display panel may include the substrate 41, the first metal layer 42, and the second metal layer 43. The first metal layer 42 may be located between the substrate 41 and the second metal layer 43. The data line D may be located within the first metal layer 42, and the data connecting line D10 may be at least partially located within the second metal layer 43, thereby achieving electrical insulation between the data connecting line D10 and the data line D that is not connected to the data connecting line D10. The first detection line 10 may be at least partially located within the second metal layer 43, in other words, the film layer where the data connecting line D10 is located may be multiplexed for disposing the first detection line 10 without adding a new layer, which may effectively reduce the manufacturing process and production cost. In one embodiment, the portion of the data connecting line D10 located within the second metal layer 43 and the portion of the first detection line 10 located within the second metal layer 43 may be made of a same material using a same process.

It should be noted that in one embodiment, for illustrative purposes, the film layer where the data connecting line D10 is located may be multiplexed for disposing the first detection line 10 as an example. In certain embodiments, any other film layer may be multiplexed for disposing the first detection line 10, which may not be repeated herein.

It should be noted that for clearly illustrating the positional relationship between the data line D, the data connecting line D10, and the first detection line 10, sub-pixels may not be shown in FIG. 3. In actual products, the data line D may be electrically connected to the sub-pixel, and the corresponding structure may be a common structure in such field, which may not be repeated herein.

Referring to FIG. 3 and FIG. 4, in certain embodiments, the data line D may include a second data line D2, and the second data line D2 may be electrically connected to a data pad 32 through the data connecting line D10.

In one embodiment, a plurality of data connecting lines D10 may be disposed in the second metal layer 43, and the data connecting line D10 may be connected to the second data line D2 located close to the edge of the display region AA. The end of the data connecting line D10 may be extended towards the middle position of the lower side of the display region AA. In view of this, the fan-out lines corresponding to such portion of the second data line D2 may be directly connected to the data pad 32 at the middle position of the lower side of the display region AA, and may not need to be extended in a corner region NA1. Therefore, the width of the corner region NA1 may be significantly reduced, which may optimize the narrow border design of the display panel.

Figure 5:
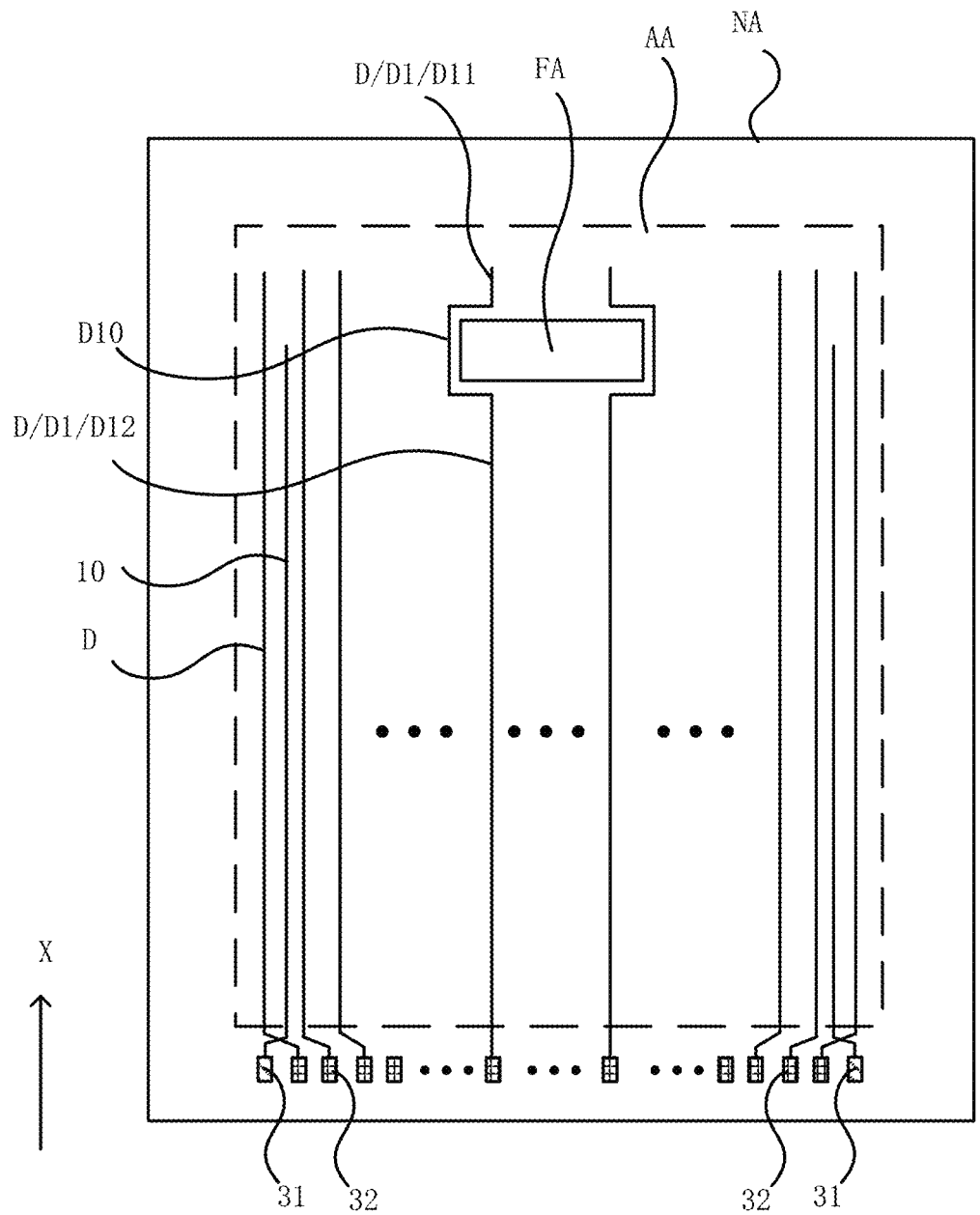
FIG. 5 illustrates a schematic diagram of a planar structure of another exemplary display panel consistent with disclosed embodiments of the present disclosure.

FIG. 5 illustrates a schematic diagram of a planar structure of a display panel consistent with disclosed embodiments of the present disclosure. Referring to FIG. 4 and FIG. 5, in certain embodiments, the display panel may further include a functional device region FA, and the display region AA may surround the functional device region FA.

The data line D may include a first data line D1. The first data line D1 may include a first data segment D11 and a second data segment D12, and the first data segment D11 and the second data segment D12 may be located on both sides of the functional device region FA along a first direction X. The first direction X may be parallel to the plane of the display panel. The data connecting line D10 may be electrically connected to the first data segment D11 and the second data segment D12.

In one embodiment, the display panel may further include the functional device region FA, and the display region AA may surround the functional device region FA. The functional device region FA may include a non-display region or a transparent display region. An electronic device may be disposed in the functional device region FA. The electronic device may include but may not be limited to a front-facing camera, an infrared sensor, a fingerprint recognition sensor, a speaker, etc. The functional device region FA may have a rectangular shape, a track-shape, an elliptical shape, a circular shape, or any other shape.

The data line D may include the first data line D1. The first data line D1 may be divided into the first data segment D11 and the second data segment D12 by the functional device region FA. The first data segment D11 and the second data segment D12 may be located on both sides of the functional device region FA along a first direction X. The first direction X may be parallel to the plane of the display panel. The data connecting line D10 may be electrically connected to the first data segment D11 and the second data segment D12. The data connecting line D10 may be routed around the functional device region FA within the display region AA, which may reduce the number of wire traces within the border around the functional device region FA, thereby decreasing the area of the border around the functional device region FA and increasing the area of the display region, and facilitating to improve the screen-to-body ratio of the display panel.

It should be noted that to clearly illustrate the positional relationship between the data line D, data connecting line D10, and the first detection line 10, sub-pixels may not be shown in FIG. 5. In actual products, the data line D may be electrically connected to the sub-pixel, and the corresponding structure may include a conventional structure in such field, which may not be repeated herein.

Figure 6:
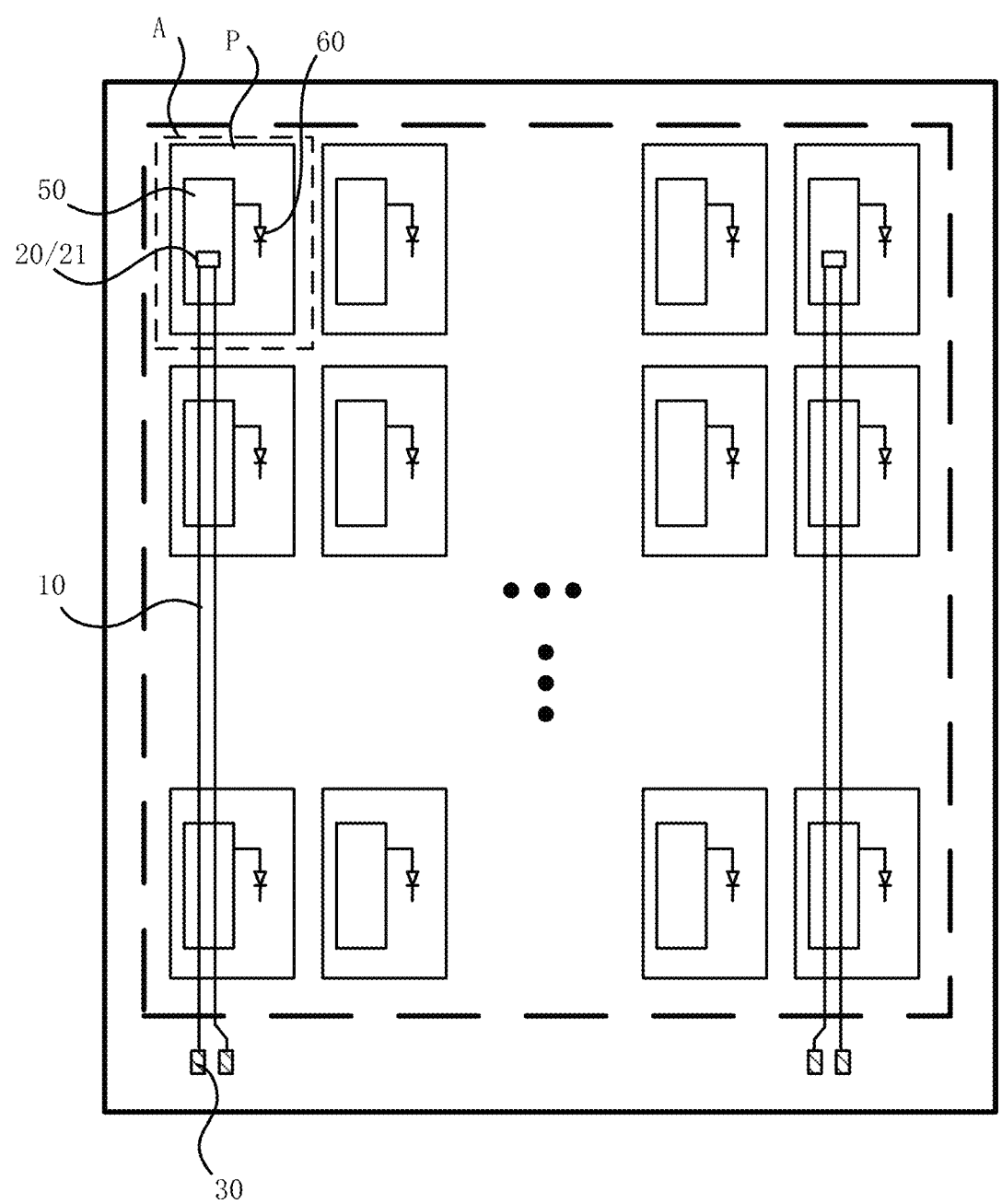
FIG. 6 illustrates a schematic diagram of another exemplary display panel consistent with disclosed embodiments of the present disclosure.
Figure 7:
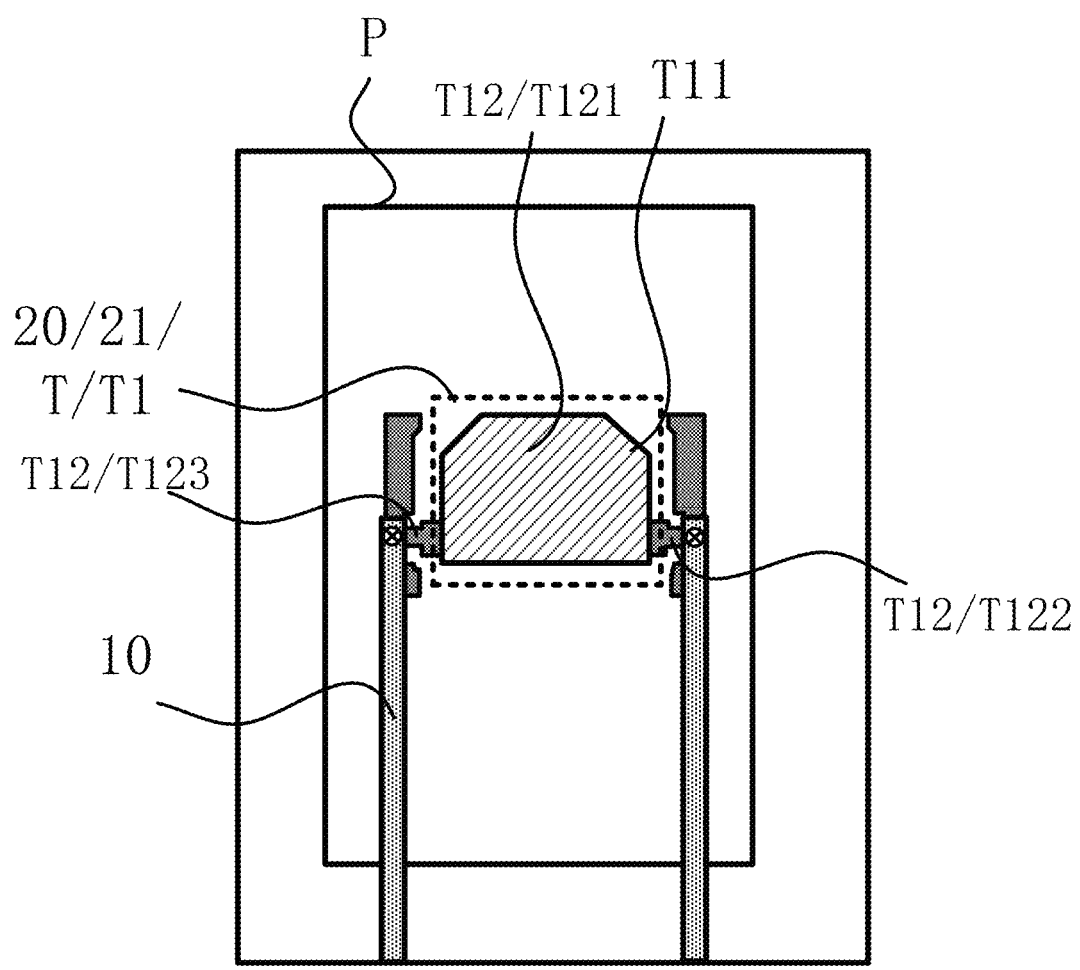
FIG. 7 illustrates a schematic diagram of a region A in the display panel in FIG. 6 consistent with disclosed embodiments of the present disclosure.

FIG. 6 illustrates a schematic diagram of a display panel consistent with disclosed embodiments of the present disclosure; and FIG. 7 illustrates a schematic diagram of a region A in the display panel in FIG. 6. It should be noted that to clearly illustrate the technical points in the present disclosure, FIG. 7 may merely illustrate the structure of the first transistor in the sub-pixel, which may not mean that the sub-pixel may merely include the first transistor. The sub-pixel shown in FIG. 3 may further include any other structure.

Referring to FIG. 2 and FIG. 3, in certain embodiments, the sub-pixel P may include a pixel circuit 50 and a light-emitting element 60 electrically connected to the pixel circuit 50. The pixel circuit 50 may include a plurality of transistors T, and at least one transistor T in at least one pixel circuit 50 may include a first transistor T1. At least one to-be-tested device 20 may include a first to-be-tested device 21, and the first to-be-tested device 21 may include the first transistor T1.

In one embodiment, the disclosed pixel circuit 50 may include the plurality of transistors T, and at least one transistor T in at least one pixel circuit 50 may include the first transistor T1. It should be noted that in specific implementations, the pixel circuit 50 may include but may not be limited to the disclosed structure. The pixel circuit 50 may also include any other structure that is capable of achieving the light-emitting function of the light-emitting element 60, such as a transistor, a capacitor, etc., which may not be repeated herein. The structure of the pixel circuit 50 may be understood by referring to related technologies.

At least one to-be-tested device 20 may include the first to-be-tested device 21, and the first to-be-tested device 21 may include the first transistor T1. The first transistor T1 may be electrically connected to the first detection line 10, and the first detection line 10 may be electrically connected to the detection pad 31. In other words, the detection pad 31 may serve as a test terminal. The current signal on the first transistor T1 in the sub-pixel P may be transmitted to the detection pad 31 through the first detection line 10. According to the signal on the detection pad 31, the current signal on the first detection line 10 electrically connected to the detection pad 31 may be determined. According to the current signal, whether there are defects in the first transistor T1 electrically connected to the first detection line 10 may be determined, which may enable the identification and elimination of defective products based on the detection results, may prevent the defective products from being released into the market, and may improve product yield. The detection structure of the disclosed display panel may be simple, which may enable direct detection of whether there are issues in the first transistor T1 in the sub-pixel P in the display region AA, may facilitate to achieve the detection of the first transistor T1 in the sub-pixel P of the display panel, thereby improving product quality and yield and reducing cost.

Referring to FIG. 6 and FIG. 7, in certain embodiments, the first transistor T1 may be connected to two first detection lines 10. One of the two first detection lines 10 may be connected to a source signal of the first transistor T1, and the other one of the two first detection lines 10 may be connected to a drain signal of the first transistor T1.

During the detection process, an enable signal may be provided to the gate of the first transistor T1 to turn on the first transistor T1. Because among the two first detection lines 10 electrically connected to the first transistor T1, one of the two first detection lines 10 is connected to a source signal of the first transistor T1, and the other one of the two first detection lines 10 is connected to a drain signal of the first transistor T1, the source current signal and the drain current signal of the first transistor T1 may be respectively obtained through the two first detection lines 10 electrically connected to the first transistor T1. Whether there are defects in the first transistor T1 may be determined according to the source current signal and the drain current signal, which may enable the identification and elimination of defective products based on the detection results, may prevent the defective products from being released into the market, and may improve product yield.

In one embodiment, a certain gate voltage may be applied to the gate of the first transistor T1. Based on the source current signal and the drain current signal respectively obtained from the two first detection lines 10 electrically connected to the first transistor T1, it may be determined whether the characteristics of the first transistor T1 are normal and whether the characteristics of the first transistor T1 meet the requirements.

Referring to FIG. 6 and FIG. 7, in certain embodiments, the first transistor T1 may include a source (not shown in the Figure), a drain (not shown in the Figure), a gate T11, and an active layer T12. The active layer T12 may include a source region T122, a drain region T123, and a channel region T121. The source region T122 may be electrically connected to the source, and the drain region T123 may be electrically connected to the drain. Along a direction perpendicular to the plane where the display panel is located, the channel region T121 may at least partially overlap with the gate T11.

Among the two first detection lines 10 electrically connected to the first transistor T1, one first detection line 10 may be electrically connected to the source region T122, and the other first detection line 10 may be electrically connected to the drain region T123.

Specifically, among the two first detection lines 10 connected to the first transistor T1, one first detection line 10 may be directly electrically connected to the source region T122, and the other first detection line 10 may be directly electrically connected to the drain region T123. Therefore, the source current signal and the drain current signal of the first transistor T1 may be obtained separately from the two first detection lines 10 electrically connected to the first transistor T1. Whether there are defects in the first transistor T1 may be determined according to the source current signal and the drain current signal, which may enable the identification and elimination of defective products based on the detection results, may prevent the defective products from being released into the market, and may improve product yield.

It should be noted that in certain embodiments, the two first detection lines 10 electrically connected to the first transistor T1 may adopt any other connection method to obtain the source signal and the drain signal of the first transistor T1. For example, among the two first detection lines 10 electrically connected to the first transistor T1, one first detection line 10 may be electrically connected to the source, and the other first detection line 10 may be electrically connected to the drain. In view of this, the source current signal and the drain current signal of the first transistor T1 may be obtained separately from the two first detection lines 10 electrically connected to the first transistor T1, which may not be repeated herein.

Figure 8:
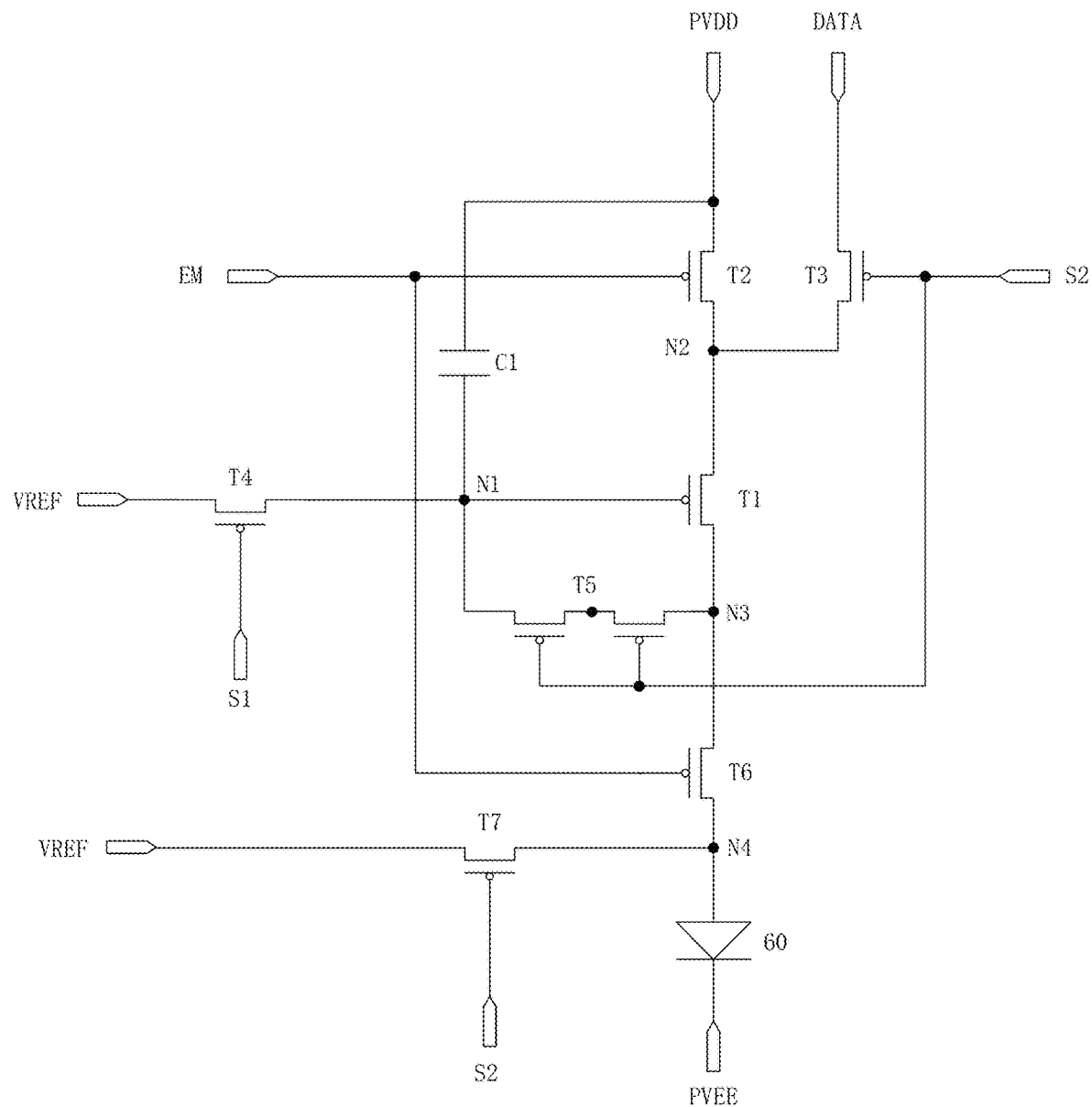
FIG. 8 illustrates a circuit diagram of a pixel circuit of an exemplary display panel consistent with disclosed embodiments of the present disclosure.
Figure 9:
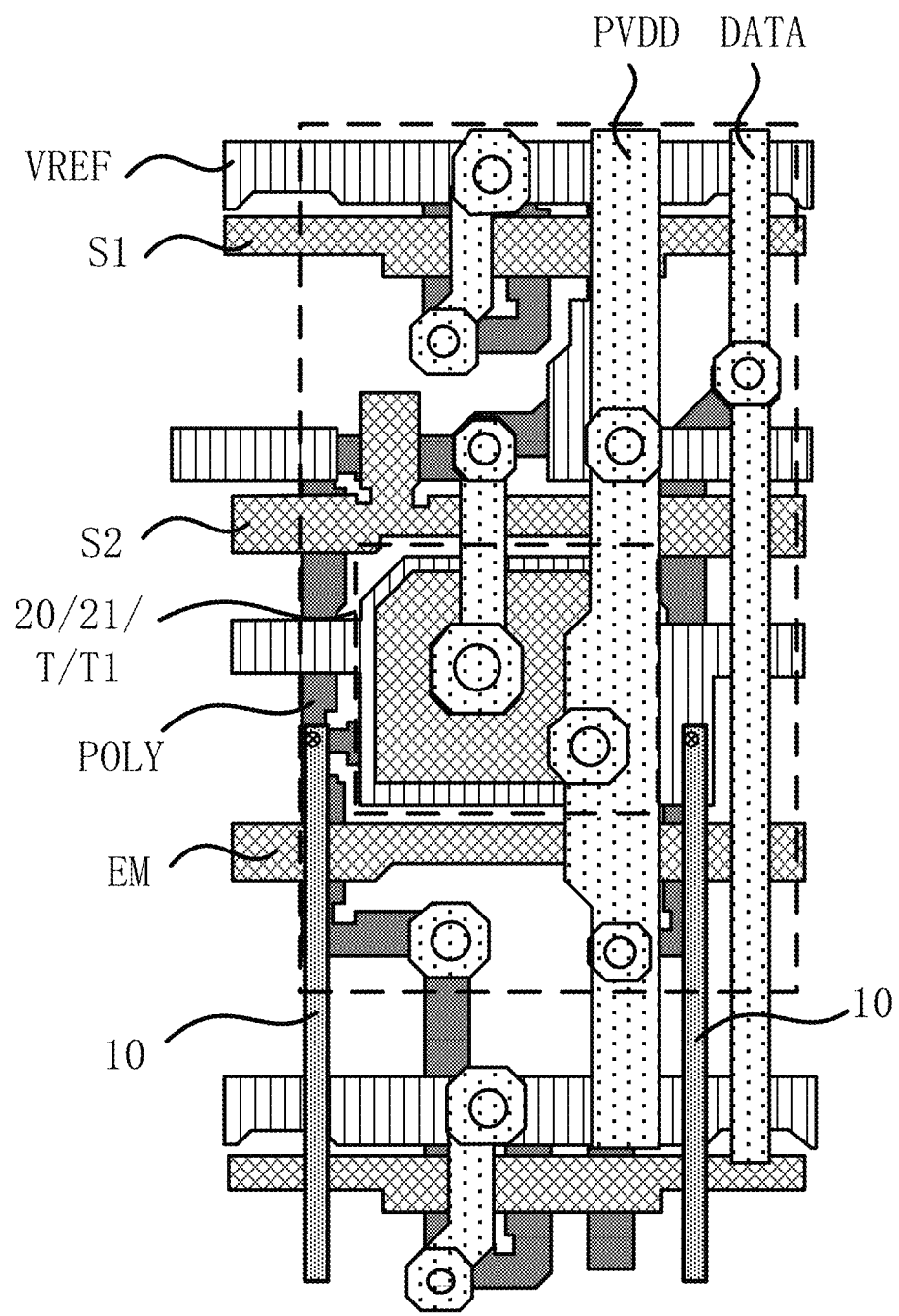
FIG. 9 illustrates a local circuit layout of another exemplary display panel consistent with disclosed embodiments of the present disclosure.

FIG. 8 illustrates a circuit diagram of a pixel circuit of a display panel consistent with disclosed embodiments of the present disclosure; and FIG. 9 illustrates a local circuit layout of another display panel consistent with disclosed embodiments of the present disclosure. Referring to FIG. 6, FIG. 8, and FIG. 9, in certain embodiments, the first transistor T1 may serve as a driving transistor.

In one embodiment, the driving transistor in the pixel circuit 50 may be configured to generate a driving current for the light-emitting element 60 to emit light. Defects in the driving transistor may directly affect the light-emitting effect of the light-emitting element 60, thereby affecting the display effect. Therefore, the detection of the driving transistor in the pixel circuit 50 may be crucial.

The first transistor T1 may serve as the driving transistor, and may be electrically connected to the source region and drain region of the driving transistor by setting two first detection lines 10, respectively. Therefore, the source current signal and the drain current signal of the driving transistor may be obtained from the two first detection lines 10, respectively. Based on the source current signal and the drain current signal, it may be determined whether there are defects in the driving transistor, which may enable the identification and elimination of defective products based on the detection results, may prevent the defective products from being released into the market, and may improve product yield.

It should be noted that FIG. 8 and FIG. 9 may exemplarily illustrate a 7T1C pixel circuit in the display panel as an example. In certain embodiments, the pixel circuit 50 in the display panel may include any other type, and the structure of the driving transistor in the pixel circuit may be set according to the structures described in the above-disclosed embodiments.

Figure 10:
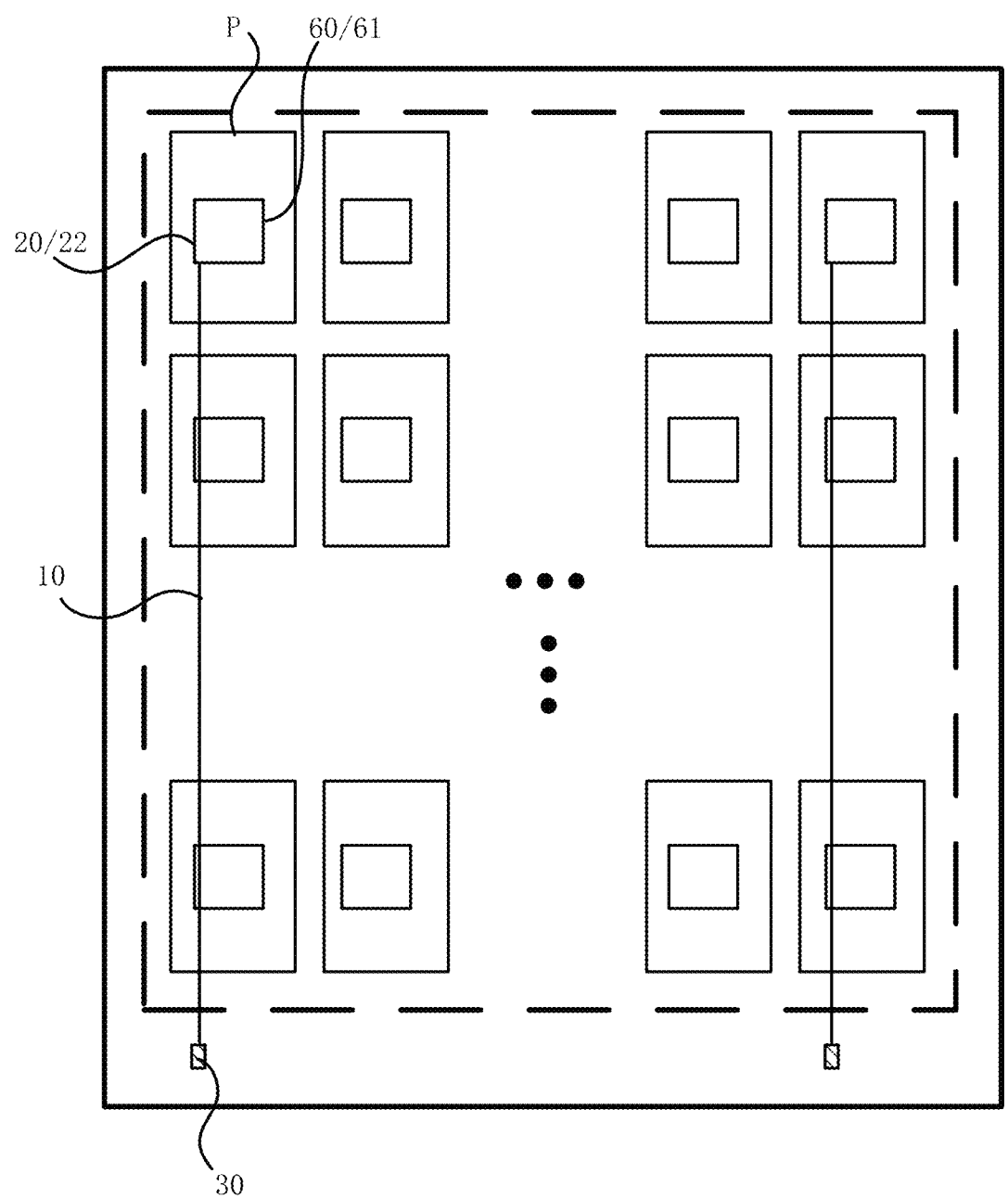
FIG. 10 illustrates a schematic diagram of another exemplary display panel consistent with disclosed embodiments of the present disclosure.
Figure 11:
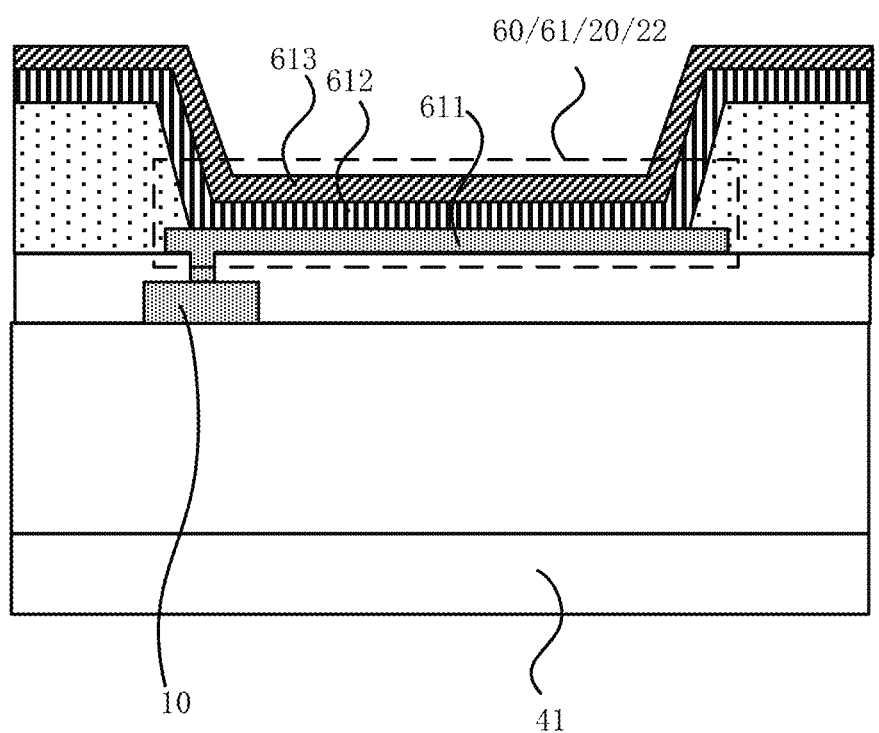
FIG. 11 illustrates a local schematic diagram of another exemplary display panel consistent with disclosed embodiments of the present disclosure.

FIG. 10 illustrates a schematic diagram of a display panel consistent with disclosed embodiments of the present disclosure; and FIG. 11 illustrates a local schematic diagram of a display panel consistent with disclosed embodiments of the present disclosure. Referring to FIG. 10 and FIG. 11, in certain embodiments, the sub-pixel P may include the pixel circuit (not shown in the Figure) and the light-emitting element 60 electrically connected to the pixel circuit.

At least one light-emitting element 60 in at least one sub-pixel P may include a first light-emitting element 61. At least one to-be-tested device 20 may include a second to-be-tested device 22, and the second to-be-tested device 22 may include the first light-emitting element 61.

In one embodiment, at least one to-be-tested device 20 may include the second to-be-tested device 22, and the second to-be-tested device 22 may include the first light-emitting element 61. The first light-emitting element 61 may be electrically connected to the first detection line 10, and the first detection line 10 may be electrically connected to the detection pad 31, which may serve as a test terminal. The current signal on the first light-emitting element 61 in the sub-pixel P may be transmitted to the detection pad 31 through the first detection line 10. According to the signal on the detection pad 31, the current signal on the first detection line 10 electrically connected to the detection pad 31 may be determined, and it may be determined whether the current signal on the first light-emitting element 61 electrically connected to the first detection line 10 conforms to the expected current curve. Therefore, it may be determined whether there are defects in the pixel circuit electrically connected to the first light-emitting element 61, which may enable the identification and elimination of defective products based on the detection results, may prevent the defective products from being released into the market, and may improve product yield. The detection structure of the disclosed display panel may be simple, which may enable direct detection of whether there are issues in the pixel circuit electrically connected to the first light-emitting element 61 in the sub-pixel P in the display region AA, may facilitate to achieve the detection of the pixel circuit in the sub-pixel P of the display panel, thereby improving product quality and yield and reducing cost.

It should be noted that FIG. 10 and FIG. 11 may exemplarily illustrate that the sub-pixel P may include the light-emitting element 60. In specific implementations, the sub-pixel P may not be limited to the disclosed structure. The sub-pixel P may include any other structure that is capable of achieving light-emitting function of the light-emitting element 60, such as a pixel circuit. The pixel circuit may include a transistor, a capacitor, etc., which may not be repeated herein. The specific structure of the sub-pixel may be referred to related technologies.

In one embodiment, at least one to-be-tested device 20 may simultaneously include the first to-be-tested device 21 and the second to-be-tested device 22. The first to-be-tested device 21 may be electrically connected to two first detection lines 10, and the second to-be-tested device 22 may be electrically connected to one first detection line 10. The specific setting may refer to the corresponding structures in the above-disclosed embodiments, which may not be repeated herein.

Referring to FIG. 10 and FIG. 11, in certain embodiments, the first light-emitting element 61 may include a cathode 611 and an anode 613 that are disposed opposite to each other, and at least one first detection line 10 may be electrically connected to the anode 611.

In one embodiment, the first light-emitting element 61 may include the cathode 611 and the anode 613 that are disposed opposite to each other, and an organic functional layer 612 disposed between the cathode 611 and anode 613. The pixel circuit may be electrically connected to the anode 611 of the first light-emitting element 61, and may provide the driving current to the corresponding first light-emitting element 61. At least one first detection line 10 may be electrically connected to the anode 611.

During the detection process, the pixel circuit may be controlled to provide the driving current to the corresponding first light-emitting element 61 electrically connected to the pixel circuit, to enable the light-emitting element 61 to emit light. Because the first detection line 10 is electrically connected to the anode 611 of the first light-emitting element 61, the anode current signal of the first light-emitting element 61 may be obtained from the first detection line 10 electrically connected to the light-emitting element 61. Based on the anode current signal, it may be determined whether there are defects in the pixel circuit electrically connected to the first light-emitting element 61, which may enable the identification and elimination of defective products based on the detection results, may prevent the defective products from being released into the market, and may improve product yield.

In one embodiment, the pixel circuit may be controlled to provide the driving current to the first light-emitting element 61 electrically connected to the pixel circuit, to enable the light-emitting element 61 to emit light. The anode current signal of the first light-emitting element 61 may be obtained from the first detection line 10. Based on the anode current signal, it may be determined whether the anode current signal conforms to the expected current curve, and then whether there are defects in the pixel circuit connected to the first light-emitting element 61 may be determined.

Referring to FIG. 10 and FIG. 11, in certain embodiments, at least one first detection line 10 may be electrically connected to the anode 611.

In one embodiment, at least one first detection line 10 may be directly connected to the anode 611, and thus the anode current signal of the first light-emitting element 61 may be obtained from the first detection line 10 electrically connected to the anode 611. Based on the anode current signal, it may be determined whether there are defects in the pixel circuit connected to the first light-emitting element 61, which may enable the identification and elimination of defective products based on the detection results, may prevent the defective products from being released into the market, and may improve product yield.

It should be noted that in certain embodiments, when the first detection line 10 is electrically connected to the anode 611, various connection methods may be used, for example, the direct connection between the first detection line 10 and the anode 611. The specific method of connecting the first detection line 10 to the anode 611 may not be repeated herein.

Figure 12:
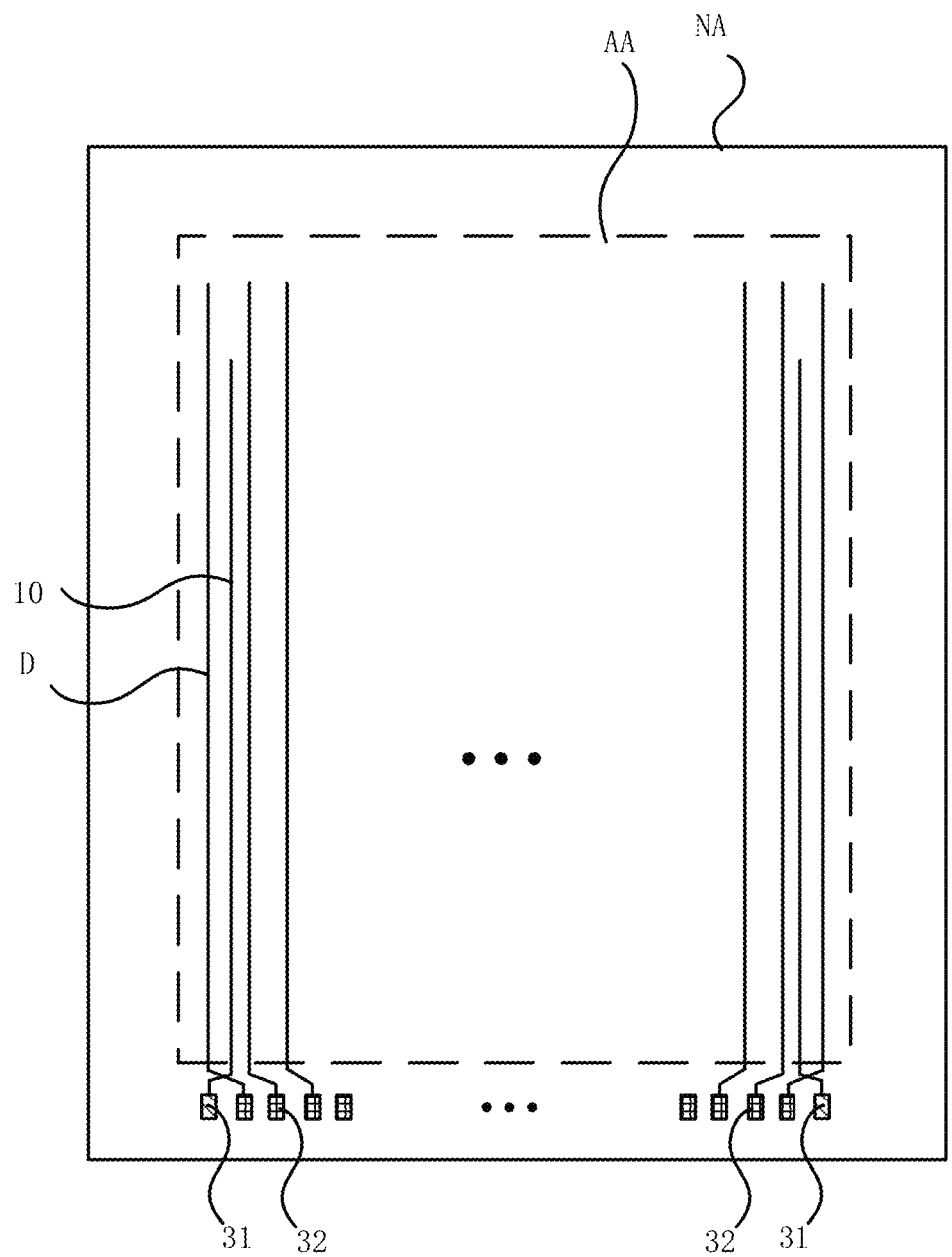
FIG. 12 illustrates a schematic diagram of another exemplary display panel consistent with disclosed embodiments of the present disclosure.

FIG. 12 illustrates a schematic diagram of another display panel consistent with various embodiments of the present disclosure. In certain embodiments, the non-display region NA may further include a plurality of data pads 32. The display panel may further include a plurality of data lines D, and the data line D may be electrically connected to the data pad 32. The detection pad 31 and the data pad 32 may be located on a same side of the display region AA.

In one embodiment, the display panel may include a plurality of data lines D, and the data line D may be electrically connected to the data pad 32. The data pad 32 may provide a data voltage signal to the data lines D electrically connected to the data pad 32. The data pads 32 may be disposed in the non-display region NA. Accordingly, the detection pad 31 and the data pad 32 may be located on the same side of the display region AA. In other words, the detection pads 31 may be located in a region where the data pads 32 are located in the non-display region NA, which may not affect the operation and testing of other components in the display panel. Moreover, the detection pad 31 and the data pad 32 may be made of a same material and fabricated using a same process, which may facilitate to reduce the manufacturing process and reduce the production cost.

Figure 13:
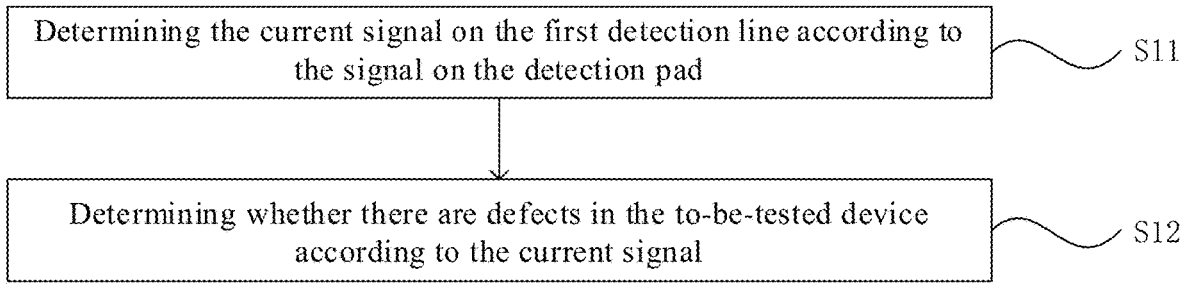
FIG. 13 illustrates a schematic flowchart of an exemplary detection method consistent with disclosed embodiments of the present disclosure.

FIG. 13 illustrates a schematic flowchart of a detection method consistent with various embodiments of the present disclosure. Referring to FIG. 1 and FIG. 13, the disclosed embodiment may provide a detection method of a display panel. The display panel may include a display region AA and a non-display region NA surrounding the display region AA. The display region AA may include a plurality of sub-pixels P and at least one first detection line 10. At least one sub-pixel P may include at least one to-be-tested device 20, and the at least one to-be-tested device 20 may be electrically connected to the at least one first detection line 10. The non-display region NA may include at least one detection pad 31, and the first detection line 10 may be electrically connected to the detection pad 31.

The detection method may include following steps.

S11: Determining the current signal on the first detection line according to the signal on the detection pad.

S12: Determining whether there are defects in the to-be-tested device according to the current signal.

In one embodiment, at least one sub-pixel P in the display region AA may include at least one to-be-tested device 20, and the to-be-tested device 20 may be electrically connected with the first detection line 10. The first detection line 10 may be electrically connected with the detection pad 31, in other words, the detection pad 31 may serve as a test terminal. A current signal on the to-be-tested device 20 in the sub-pixel P may be transmitted to the detection pad 31 through the first detection line 10. The current signal on the first detection line 10 electrically connected to the detection pad 31 may be determined based on the signal on the detection pad 31. Therefore, according to the current signal, it may be determined whether there are defects in the device in the sub-pixel P where the to-be-tested device 20 electrically connected to the first detection line 10 is located. The operational characteristics and parameters of the device in the sub-pixel P may be detected according to the current signal, which may enable the identification and elimination of defective products, may prevent the defective products from being released into the market, and may improve product yield. The detection structure of the disclosed display panel may be simple, which may enable direct detection of whether there are issues in the device in the sub-pixel P in the display region AA, may facilitate to achieve the detection of the device in the sub-pixel P of the display panel, thereby improving product quality and yield and reducing cost.

Figure 14:
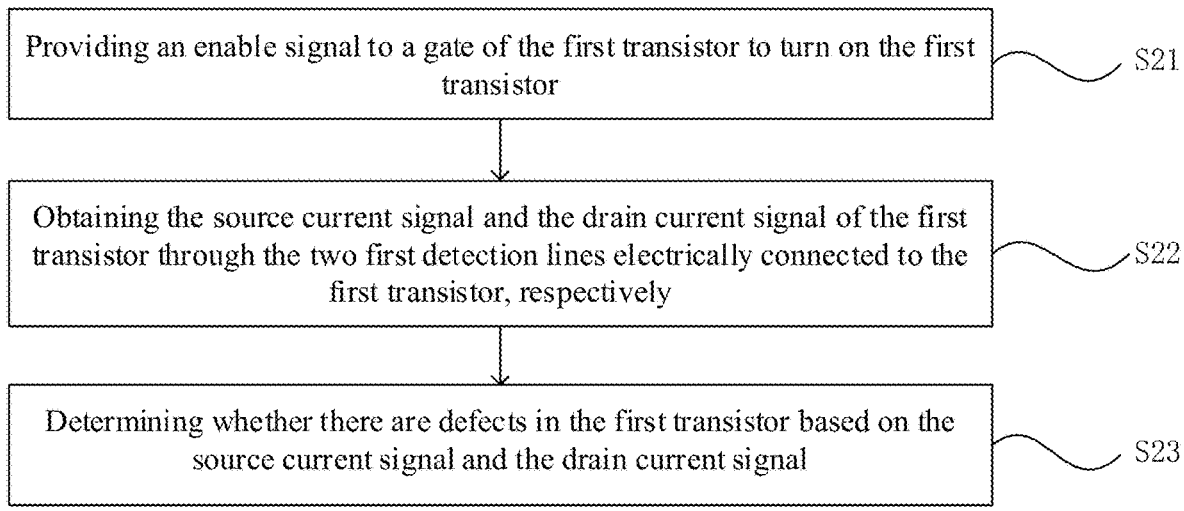
FIG. 14 illustrates a schematic flowchart of another exemplary detection method consistent with disclosed embodiments of the present disclosure.

FIG. 14 illustrates a schematic flowchart of another detection method consistent with various embodiments of the present disclosure. Referring to FIG. 6, FIG. 7 and FIG. 14, in certain embodiments, the sub-pixel P may include a pixel circuit 50 and a light-emitting element 60 electrically connected to the pixel circuit 50. The pixel circuit 50 may include a plurality of transistors T, and at least one transistor T in the pixel circuit 50 may include a first transistor T1. The at least one to-be-tested device 20 may include a first to-be-tested device 21, and the first to-be-tested device 21 may include the first transistor T1. The first transistor T1 may be electrically connected to two first detection lines 10, where one of the two first detection lines 10 may be connected to a source signal of the first transistor T1, and the other one of the two first detection lines 10 may be connected to a drain signal of the first transistor T1.

The detection method may further include following steps.

S21: Providing an enable signal to a gate of the first transistor to turn on the first transistor.

S22: Obtaining the source current signal and the drain current signal of the first transistor through the two first detection lines electrically connected to the first transistor, respectively.

S23: Determining whether there are defects in the first transistor based on the source current signal and the drain current signal.

In one embodiment, the disclosed pixel circuit 50 may include the plurality of transistors T, and at least one transistor T in at least one pixel circuit 50 may include the first transistor T1. It should be noted that in specific implementations, the pixel circuit 50 may include but may not be limited to the disclosed structure. The pixel circuit 50 may also include any other structure that is capable of achieving the light-emitting function of the light-emitting element 60, such as a transistor, a capacitor, etc., which may not be repeated herein. The structure of the pixel circuit 50 may be understood by referring to related technologies.

At least one to-be-tested device 20 may include the first to-be-tested device 21, and the first to-be-tested device 21 may include the first transistor T1. The first transistor T1 may be electrically connected to the two first detection lines 10. One of the two first detection lines 10 may be connected to a source of the first transistor T1, and the other one of the two first detection lines 10 may be connected to a drain of the first transistor T1.

During the detection process, an enable signal may be provided to the gate of the first transistor T1 to turn on the first transistor T1. Because among the two first detection lines 10 electrically connected to the first transistor T1, one of the two first detection lines 10 is connected to the source signal of the first transistor T1, and the other one of the two first detection lines 10 is connected to the drain signal of the first transistor T1, the source current signal and the drain current signal of the first transistor T1 may be respectively obtained through the two first detection lines 10 electrically connected to the first transistor T1. Whether there are defects in the first transistor T1 may be determined according to the source current signal and the drain current signal, which may enable the identification and elimination of defective products based on the detection results, may prevent the defective products from being released into the market, and may improve product yield.

In one embodiment, a certain gate voltage may be applied to the gate of the first transistor T1. Based on the source current signal and the drain current signal respectively obtained from the two first detection lines 10 electrically connected to the first transistor T1, it may be determined whether the characteristics of the first transistor T1 are normal and whether the characteristics of the first transistor T1 meet the requirements.

Figure 15:
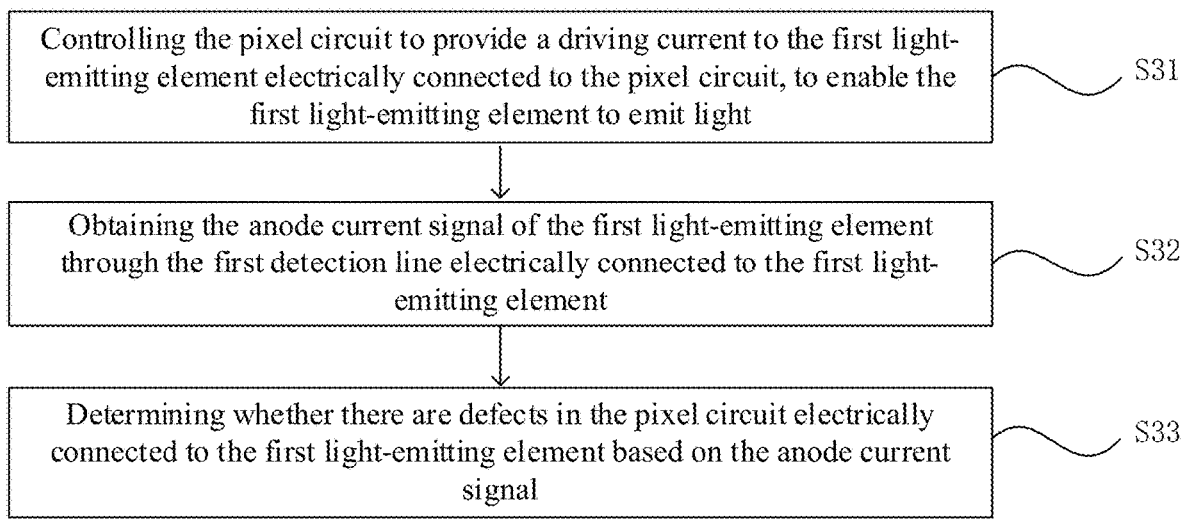
FIG. 15 illustrates a schematic flowchart of another exemplary detection method consistent with disclosed embodiments of the present disclosure.

FIG. 15 illustrates a schematic flowchart of another detection method consistent with various embodiments of the present disclosure. Referring to FIG. 10, FIG. 11, and FIG. 15, in certain embodiments, the sub-pixel P may further include a pixel circuit (not shown) and a light-emitting element 60 electrically connected to the pixel circuit. At least one light-emitting element 60 in at least one sub-pixel P may include a first light-emitting element 61. At least one to-be-tested device 20 may include a second to-be-tested device 22, and the second to-be-tested device 22 may include the first light-emitting element 61. The first light-emitting element 61 may include an anode 611 and a cathode 613 that are disposed opposite to each other, and at least one first detection line 10 may be electrically connected to the anode 611.

The detection method may further include following.

S31: Controlling the pixel circuit to provide a driving current to the first light-emitting element electrically connected to the pixel circuit, to enable the first light-emitting element to emit light.

S32: Obtaining the anode current signal of the first light-emitting element through the first detection line electrically connected to the first light-emitting element.

S33: Determining whether there are defects in the pixel circuit electrically connected to the first light-emitting element based on the anode current signal.

In one embodiment, the sub-pixel P may include the pixel circuit and the light-emitting element 60 electrically connected to the pixel circuit. The pixel circuit may be configured to provide the driving current to drive the light-emitting element 60 to emit light. The light-emitting element 60 in at least one sub-pixel P may include a first light-emitting element 61, and at least one to-be-tested device 20 may include a second to-be-tested device 22. The second to-be-tested device 22 may include the first light-emitting element 61. At least one first detection line 10 may be electrically connected to the first light-emitting element 61. The first light-emitting element 61 may include the anode 611 and the cathode 613 that are disposed opposite to each other, and an organic functional layer 612 disposed between the cathode 611 and anode 613. The pixel circuit may be electrically connected to the anode 611 of the first light-emitting element 61, and may provide the driving current to the corresponding first light-emitting element 61. At least one first detection line 10 may be electrically connected to the anode 611.

During the detection process, the pixel circuit may be controlled to provide the driving current to the corresponding first light-emitting element 61 electrically connected to the pixel circuit, to enable the light-emitting element 61 to emit light. Because the first detection line 10 is electrically connected to the anode 611 of the first light-emitting element 61, the anode current signal of the first light-emitting element 61 may be obtained from the first detection line 10 electrically connected to the light-emitting element 61. Based on the anode current signal, it may be determined whether there are defects in the pixel circuit electrically connected to the first light-emitting element 61, which may enable the identification and elimination of defective products based on the detection results, may prevent the defective products from being released into the market, and may improve product yield.

In one embodiment, the pixel circuit may be controlled to provide the driving current to the first light-emitting element 61 electrically connected to the pixel circuit, to enable the light-emitting element 61 to emit light. The anode current signal of the first light-emitting element 61 may be obtained from the first detection line 10. Based on the anode current signal, it may be determined whether the anode current signal conforms to the expected current curve, and then it may be determined whether there are defects in the pixel circuit connected to the first light-emitting element 61.

Figure 16:
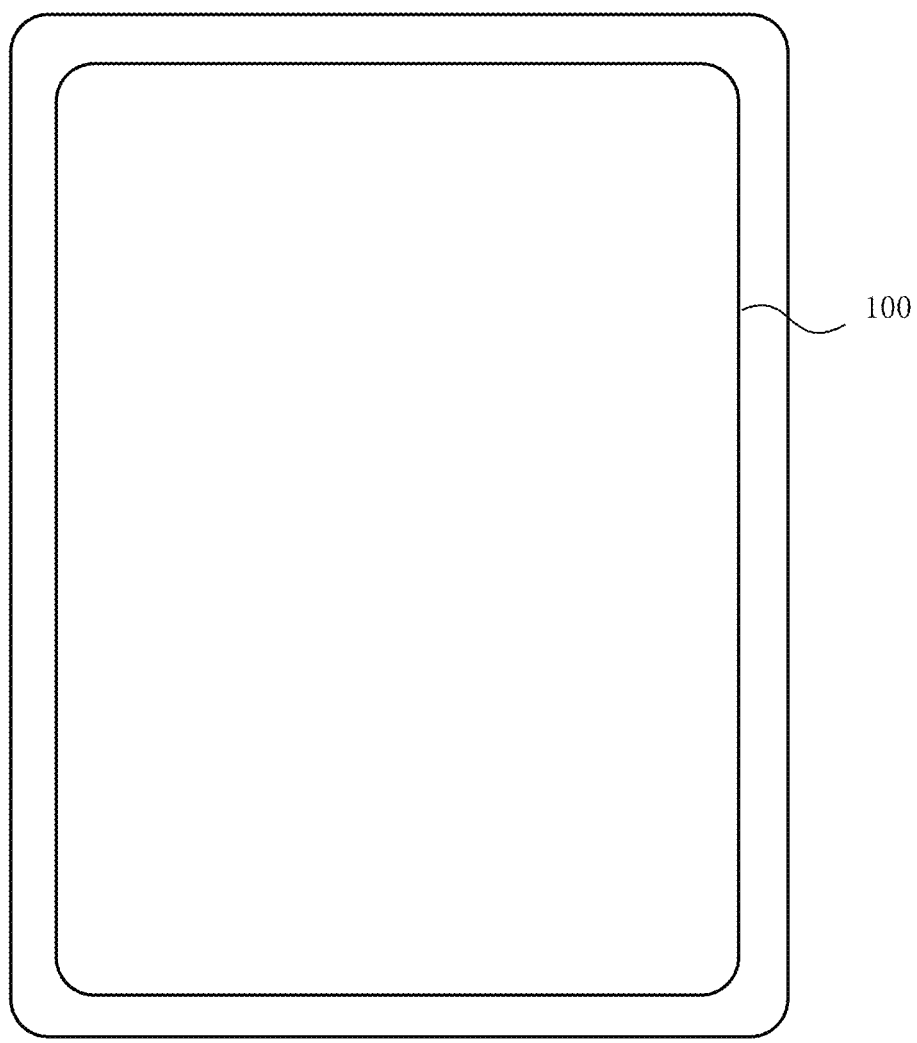
FIG. 16 illustrates a schematic diagram of an exemplary display device consistent with disclosed embodiments of the present disclosure.

The present disclosure also provides a display device. FIG. 16 illustrates a schematic diagram of a display device consistent with disclosed embodiments of the present disclosure. In one embodiment, referring to FIG. 16, the display device 1000 includes the display panel 100 provided in any one of the disclosed embodiments of the present disclosure. FIG. 16 may merely use a mobile phone to describe the display device 1000 as an example. It should be understood that the display device 1000 in the disclosed embodiments may be any other display device 1000 with a display function, such as a computer, a TV, and a car display device, etc., which may not be limited by the present disclosure. The display device 1000 may have the beneficial effects of display panel, which may refer to the descriptions of the disclosed display panel 100 in the disclosed embodiments, and may not be repeated herein.

The disclosed display panel, detection method of the display panel, and display device may have following beneficial effects. In the disclosed display panel, at least one sub-pixel in the display region may include at least one to-be-tested device, and the to-be-tested device may be electrically connected with the first detection line. The first detection line may be electrically connected with the detection pad, in other words, the detection pad may serve as a test terminal. A current signal on the to-be-tested device in the sub-pixel may be transmitted to the detection pad through the first detection line. The current signal on the first detection line electrically connected to the detection pad may be determined based on the signal on the detection pad. Therefore, according to the current signal, it may be determined whether there are defects in the device in the sub-pixel where the to-be-tested device electrically connected to the first detection line is located. The operational characteristics and parameters of the device in the sub-pixel may be detected according to the current signal, which may enable the identification and elimination of defective products, may prevent the defective products from being released into the market, and may improve product yield. The detection structure of the disclosed display panel may be simple, which may enable direct detection of whether there are issues in the device in the sub-pixel in the display region, may facilitate to achieve the detection of the device in the sub-pixel of the display panel, thereby improving product quality and yield and reducing cost.

The description of the disclosed embodiments is provided to illustrate the present disclosure to those skilled in the art.

Various modifications to these embodiments will be readily apparent to those skilled in the art, and the generic principles defined herein may be applied to other embodiments without departing from the spirit or scope of the disclosure. Thus, the present disclosure is not intended to be limited to the embodiments illustrated herein but is to be accorded the widest scope consistent with the principles and novel features disclosed herein.

What is claimed is:

1. A display panel, comprising:
a display region and a non-display region surrounding the display region, wherein:
the display region includes a plurality of sub-pixels and at least one first detection line, at least one sub-pixel of the plurality of sub-pixels includes at least one to-be-tested device in the display region, and the at least one to-be-tested device includes a first transistor that is electrically connected to two first detection lines of the at least one first detection line, wherein the first transistor is a driving transistor configured to generate a driving current for a light-emitting element included in the at least one sub-pixel in the at least one to-be-tested device, and
the non-display region includes at least one detection pad serving as a detection terminal,
wherein one of the two first detection lines directly connects a source region of an active layer of the driving transistor to a detection pad of the at least one detection pad without through any transistor, and the other one of the two first detection lines directly connects a drain region of the active layer of the same driving transistor to another detection pad of the at least one detection pad without through any transistor, and wherein each of the two first detection lines is a line without any transistor.

2. The display panel according to claim 1, wherein:
the at least one first detection line and the at least one to-be-tested device are located in different film layers.

3. The display panel according to claim 1, further including:
a plurality of data lines and at least one data connecting line, wherein at least one data line of the plurality of data lines is electrically connected to a data connecting line of the at least one data connecting line, and the at least one data connecting line is located in the display region; and
a substrate, a first metal layer, and a second metal layer, wherein the first metal layer is located between the substrate and the second metal layer, the plurality of data lines are located within the first metal layer, the at least one data connecting line is partially located within the second metal layer, and the at least one first detection line is partially located within the second metal layer.

4. The display panel according to claim 3, further including:
a functional device region, wherein:
the display region surrounds the functional device region,
the at least one data line includes a first data line, the first data line includes a first data segment and a second data segment, and the first data segment and the second data segment are located on both sides of the functional device region along a first direction, wherein the first direction is parallel to a plane of the display panel, and the data connecting line is electrically connected to the first data segment and the second data segment.

5. The display panel according to claim 3, wherein:
the at least one data line includes a second data line, and the second data line is electrically connected to a data pad through the data connecting line.

6. The display panel according to claim 1, wherein:
a sub-pixel of the plurality of sub-pixels includes a pixel circuit and a light-emitting element electrically connected to the pixel circuit,
the pixel circuit includes a plurality of transistors, and at least one transistor of the plurality of transistors in the pixel circuit includes the first transistor, and
the at least one to-be-tested device includes a first to-be-tested device, and the first to-be-tested device includes the first transistor.

7. The display panel according to claim 1, wherein:
the first transistor includes a source, a drain, a gate, and the active layer, wherein the active layer includes the source region, the drain region, and a channel region, the source region is electrically connected to the source, the drain region is electrically connected to the drain, and along a direction perpendicular to a plane of the display panel, the channel region at least partially overlaps with the gate; and
among the two first detection lines electrically connected to the first transistor, one of the two first detection lines is electrically connected to the source region, and the other one of the two first detection lines is electrically connected to the drain region.

8. The display panel according to claim 1, wherein:
a sub-pixel of the plurality of sub-pixels includes a pixel circuit and a light-emitting element electrically connected to the pixel circuit,
the light-emitting element of the at least one sub-pixel includes a first light-emitting element, and
the at least one to-be-tested device includes a second to-be-tested device, and the second to-be-tested device includes the first light-emitting element.

9. The display panel according to claim 8, wherein:
the first light-emitting element includes a cathode and an anode that are disposed opposite to each other, and the at least one first detection line further includes one first detection line electrically connected to a signal of the anode.

10. The display panel according to claim 9, wherein:
the one first detection line is electrically connected to the anode.

11. The display panel according to claim 1, further including:
a plurality of data lines, wherein:
the non-display region includes a plurality of data pads,
a data line of the plurality of data lines is electrically connected to a data pad of the plurality of data pads, and
the at least one detection pad and the data pad are located on a same side of the display region.

12. A detection method of a display panel, comprising:
providing a display panel, wherein the display panel includes:
a display region and a non-display region surrounding the display region,
the display region includes a plurality of sub-pixels and at least one first detection line, at least one sub-pixel of the plurality of sub-pixels includes at least one to-be-tested device in the display region, and the at least one to-be-tested device includes a first transistor that is electrically connected to two first detection lines of the at least one first detection line, wherein the first transistor is a driving transistor configured to generate a driving current for a light-emitting element included in the at least one sub-pixel in the at least one to-be-tested device, and the non-display region includes at least one detection pad serving as a detection terminal, wherein one of the two first detection lines directly connects a source region of an active layer of the driving transistor to a detection pad of the at least one detection pad without through any transistor, and the other one of the two first detection lines directly connects a drain region of the active layer of the same driving transistor to another detection pad of the at least one detection pad without through any transistor, and wherein each of the two first detection lines is a line without any transistor;

determining a current signal on each of the two first detection lines according to a signal on the detection pad or the another detection pad; and determining whether there are defects in a sub-pixel where the at least one to-be-tested device is located according to the current signal.

13. The detection method according to claim 12, wherein:

a sub-pixel of the plurality of sub-pixels includes a pixel circuit and a light-emitting element electrically connected to the pixel circuit, the pixel circuit includes a plurality of transistors, and at least one transistor of the plurality of transistors in the pixel circuit includes the first transistor, the at least one to-be-tested device includes a first to-be-tested device, and the first to-be-tested device includes the first transistor, and the detection method further includes:

providing an enable signal to a gate of the first transistor to turn on the first transistor, wherein:

determining a current signal on each of the two first detection lines includes obtaining a source current signal and a drain current signal of the first transistor through the two first detection lines electrically connected to the first transistor, respectively, and determining whether there are defects in a sub-pixel where the at least one to-be-tested device is located includes determining whether there are defects in the first transistor based on the source current signal and the drain current signal.

14. The detection method according to claim 12, wherein:

a sub-pixel of the plurality of sub-pixels includes a pixel circuit and a light-emitting element electrically connected to the pixel circuit, the light-emitting element of the at least one sub-pixel includes a first light-emitting element, the at least one to-be-tested device includes a second to-be-tested device, and the second to-be-tested device includes the first light-emitting element, and the first light-emitting element includes a cathode and an anode that are disposed opposite to each other, and the at least one first detection line is electrically connected to a signal of the anode; and the detection method further includes:

controlling the pixel circuit to provide a driving current to the first light-emitting element electrically connected to the pixel circuit, to enable the first light-emitting element to emit light, obtaining an anode current signal of the first light-emitting element through the first detection line electrically connected to the first light-emitting element, and determining whether there are defects in the pixel circuit electrically connected to the first light-emitting element based on the anode current signal.

15. A display device, comprising:

a display panel, the display panel including:

a display region and a non-display region surrounding the display region, wherein:

the display region includes a plurality of sub-pixels and at least one first detection line, at least one sub-pixel of the plurality of sub-pixels includes at least one to-be-tested device in the display region, and the at least one to-be-tested device includes a first transistor that is electrically connected to two first detection lines of the at least one first detection line, wherein the first transistor is a driving transistor configured to generate a driving current for a light-emitting element included in the at least one sub-pixel in the at least one to-be-tested device, and the non-display region includes at least one detection pad serving as a detection terminal, wherein one of the two first detection lines directly connects a source region of an active layer of the driving transistor to a detection pad of the at least one detection pad without through any transistor, and the other one of the two first detection lines directly connects a drain region of the active layer of the same driving transistor to another detection pad of the at least one detection pad without through any transistor, and wherein each of the two first detection lines is a line without any transistor.

* * * * *